United States Patent
Lin et al.

(10) Patent No.: US 11,538,960 B2
(45) Date of Patent: Dec. 27, 2022

(54) EPITAXIAL LIGHT EMITTING STRUCTURE AND LIGHT EMITTING DIODE

(71) Applicant: XIAMEN SAN'AN OPTOELECTRONICS CO., LTD., Xiamen (CN)

(72) Inventors: Wen-Yu Lin, Xiamen (CN); Meng-Hsin Yeh, Xiamen (CN); Yun-Ming Lo, Xiamen (CN); Chien-Yao Tseng, Xiamen (CN); Chung-Ying Chang, Xiamen (CN)

(73) Assignee: XIAMEN SAN'AN OPTOELECTRONICS CO., LTD, Fujian (CN)

( * ) Notice: Subject to any disclaimer, the term of this patent is extended or adjusted under 35 U.S.C. 154(b) by 41 days.

(21) Appl. No.: 17/096,042

(22) Filed: Nov. 12, 2020

(65) Prior Publication Data
US 2021/0066542 A1 Mar. 4, 2021
US 2022/0013685 A2 Jan. 13, 2022

Related U.S. Application Data

(63) Continuation-in-part of application No. PCT/CN2018/087515, filed on May 18, 2018.

(51) Int. Cl.
*H01L 33/04* (2010.01)
*H01L 33/32* (2010.01)
*H01L 33/00* (2010.01)

(52) U.S. Cl.
CPC .......... *H01L 33/04* (2013.01); *H01L 33/0008* (2013.01); *H01L 33/32* (2013.01)

(58) Field of Classification Search
CPC ...... H01L 33/04; H01L 33/0008; H01L 33/32
See application file for complete search history.

(56) References Cited

U.S. PATENT DOCUMENTS

| 2012/0132887 A1* | 5/2012 | Kim | H01L 33/04 257/13 |
| 2017/0033260 A1* | 2/2017 | Huang | H01L 33/32 |

(Continued)

FOREIGN PATENT DOCUMENTS

| CN | 104157746 A | 11/2014 |
| CN | 107681027 A | 2/2018 |

OTHER PUBLICATIONS

Search Report issued to PCT application No. PCT/CN2018/087515 by the WIPO dated Feb. 15, 2019.

(Continued)

*Primary Examiner* — Mark W Tornow
(74) *Attorney, Agent, or Firm* — Thomas | Horstemeyer, LLP

(57) ABSTRACT

An epitaxial light emitting structure includes n-type and p-type semiconductor layers, and a light emitting component disposed therebetween. The light emitting component includes a multiple quantum well structure which contains a plurality of first periodic layered elements, each of which includes first, second and third layers alternately stacked on one another. For each of the first periodic layered elements, the first, second and third layers respectively have a first energy bandgap (Eg1), a second energy bandgap (Eg2), and a third energy bandgap (Eg3) that satisfy a relationship of Eg1<Eg2<Eg3. Also disclosed herein is a light emitting diode which includes the aforementioned epitaxial light emitting structure.

18 Claims, 10 Drawing Sheets

(56) References Cited

U.S. PATENT DOCUMENTS

2018/0254377 A1* 9/2018 Kuhr .................. H01L 33/0025
2020/0075798 A1* 3/2020 Sokol ................. H01L 33/0025

OTHER PUBLICATIONS

Search Report appended to an Office Action, which was issued to Chinese counterpart application No. 201880025463.X by the CNIPA dated May 31, 2021.

* cited by examiner

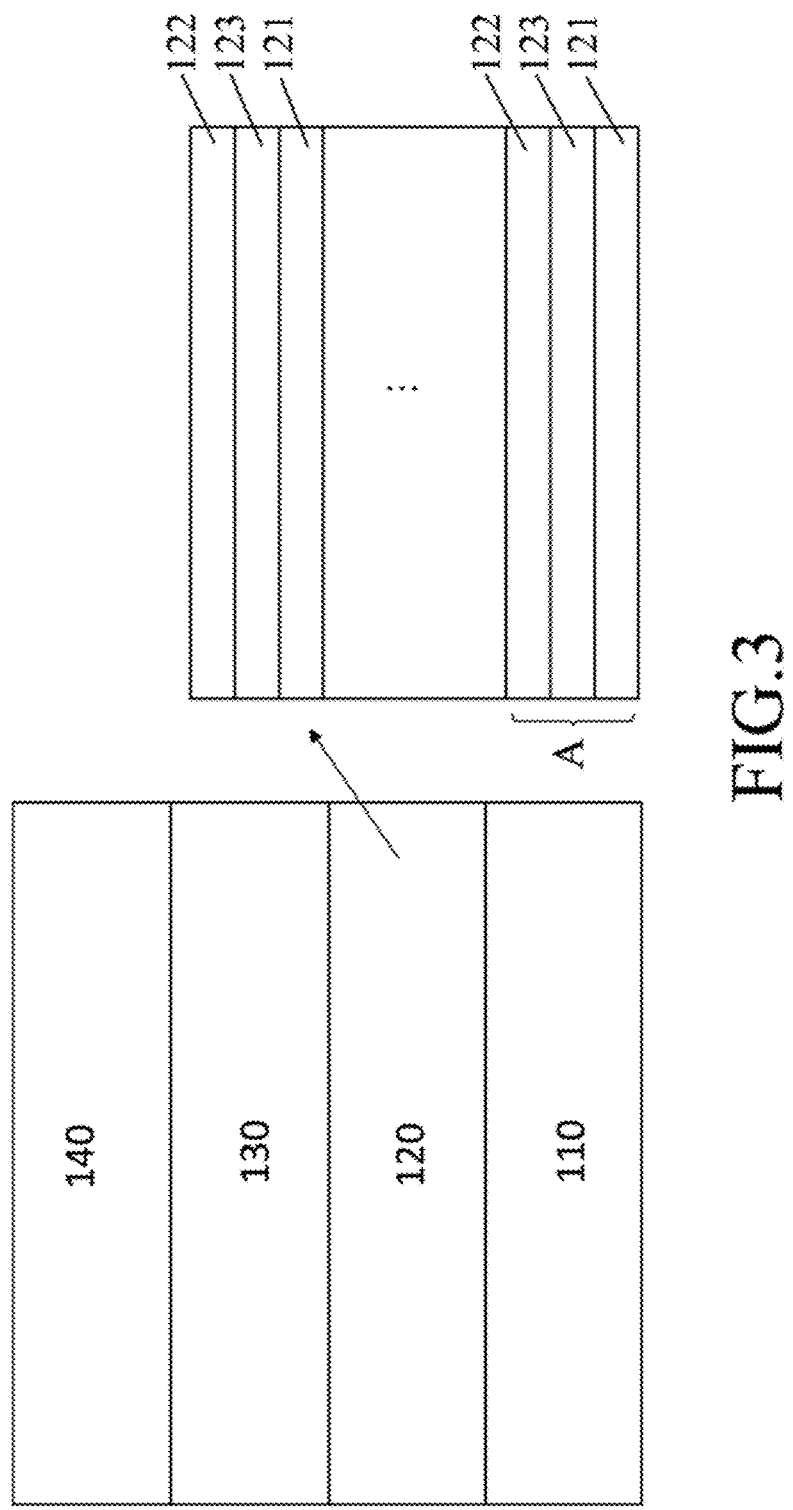

EPITAXIAL LIGHT EMITTING STRUCTURE AND LIGHT EMITTING DIODE

CROSS-REFERENCE TO RELATED APPLICATION

This application is a continuation-in-part (CIP) application of PCT International Application No. PCT/CN2018/087515, filed on May 18, 2018. The entire content of the international patent application is incorporated herein by reference.

FIELD

The disclosure relates to a light emitting diode including a multiple quantum well structure having periodic layered elements each in three layers.

BACKGROUND

A light emitting diode (LED) is a solid semiconductor light emitting device and is operated by forming a p-n junction therein to convert electrical energy into light energy. A conventional LED includes an epitaxial structure which contains n-type and p-type semiconductor layers, and a light emitting component disposed therebetween. The light emitting component generally utilizes a multiple quantum well (MQW) structure, which is made of alternately-stacked two different semiconductor layers serving as a well region and a barrier region, respectively. During operation, a voltage is applied to the LED, and carriers, i.e., electron-hole pairs, would be injected into the MQW structure by tunneling, diffusion or thermionic emission. Most of the carriers are captured to be confined in the well region, and recombine radiatively to emit light. The wavelength of light emitted from the LED is determined based on the energy bandgap of the material which forms the well region. The luminance of the LED is related to internal quantum efficiency and light extraction efficiency, and the internal quantum efficiency can be increased by adjusting the configuration of the MQW structure, such as well depth, thickness, and composition.

SUMMARY

Therefore, an object of the disclosure is to provide an epitaxial light emitting structure, and an LED including the epitaxial light emitting structure that can alleviate at least one of the drawbacks of the prior art.

According to one aspect of the disclosure, the epitaxial light emitting structure includes an n-type semiconductor layer, a p-type semiconductor layer, and a light emitting component disposed therebetween. The light emitting component includes a multiple quantum well structure which contains a plurality of first periodic layered elements. Each of the first periodic layered element includes a first layer, a second layer disposed on the first layer, and a third layer disposed on the second layer. The first layers, the second layers and the third layers in the first periodic layered elements are alternately stacked on one another. For each of the first periodic layered elements, the first, second and third layers respectively have a first energy bandgap (Eg1), a second energy bandgap (Eg2), and a third energy bandgap (Eg3) that satisfy a relationship of Eg1<Eg2<Eg3.

According to another aspect of the disclosure, an light emitting diode includes the aforementioned epitaxial light emitting structure.

BRIEF DESCRIPTION OF THE DRAWINGS

Other features and advantages of the disclosure will become apparent in the following detailed description of the embodiments with reference to the accompanying drawings, of which:

FIG. 3 is a schematic view illustrating a comparative embodiment with respect to the first embodiment;

DETAILED DESCRIPTION

Figure 1:
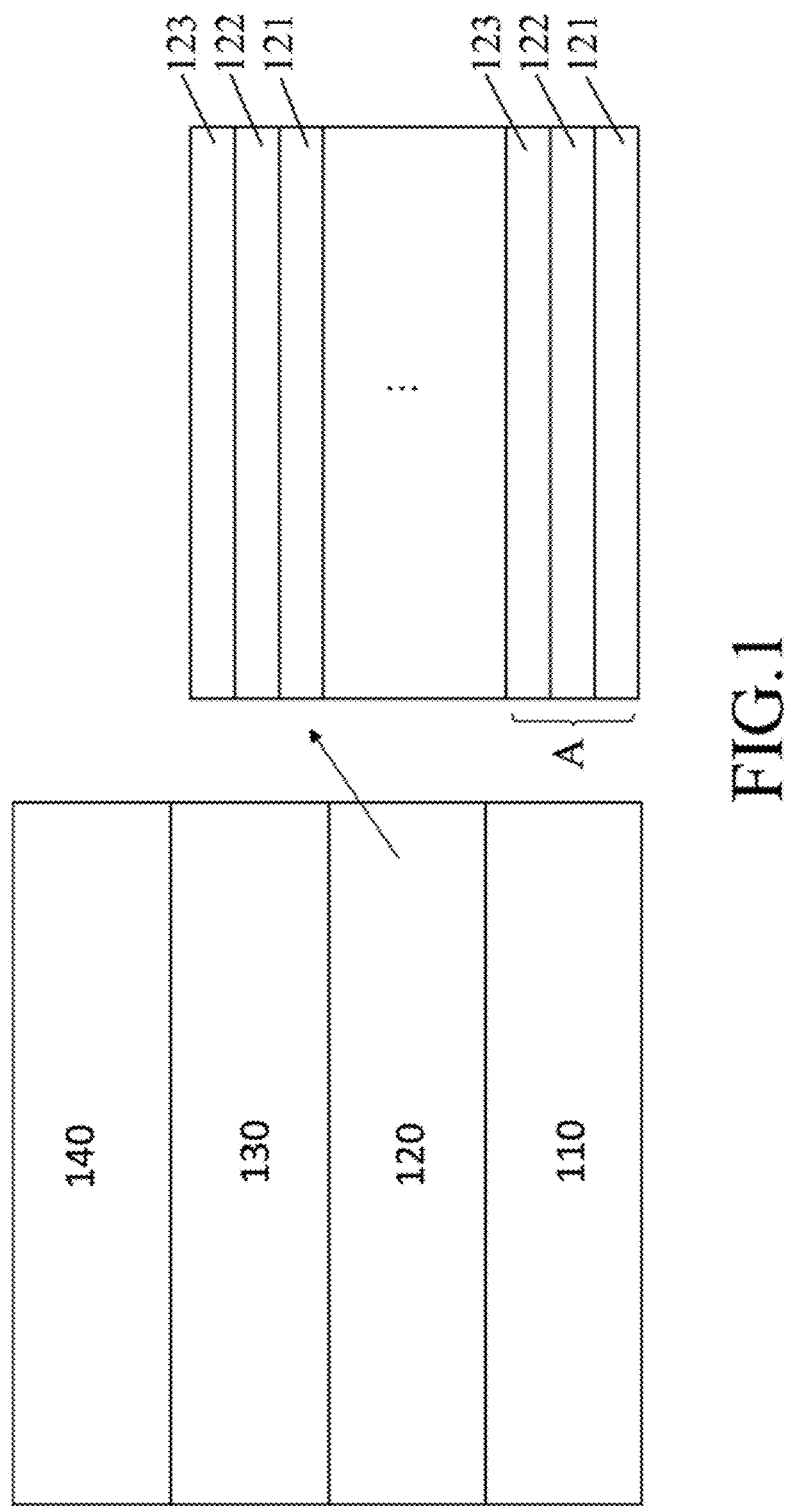
FIG. 1 is a schematic view illustrating a first embodiment of an epitaxial light emitting structure according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of an epitaxial light emitting structure 100 according to this disclosure includes an n-type semiconductor layer 110, a p-type semiconductor layer 140, and a light emitting component 120 disposed therebetween.

The n-type semiconductor layer 110 and the p-type semiconductor layer 140 may be independently made of a nitride-based semiconductor material, and each has an energy bandgap greater than that of the light emitting component 120. In certain embodiments, the n-type semiconductor layer 110 and the p-type semiconductor layer 140 is made of an aluminum gallium nitride (AlGaN)-based material or a GaN-based material.

The epitaxial light emitting structure 100 may further include a p-type electron blocking layer 130 formed between the light emitting component 120 and the p-type semiconductor layer 140. The p-type electron blocking layer 130 is made of an aluminum nitride-based semiconductor material and has an energy bandgap greater than that of the p-type semiconductor layer 140. The electron blocking layer 130 may be formed as a single layer structure or a multiple layered structure (such as a superlattice structure).

The light emitting component 120 includes a multiple quantum well (MQW) structure which contains a plurality of (i.e., at least two) first periodic layered elements (A). The light emitting component 120 is made of a nitride-based material, such as an unintentionally doped nitride-based material. A number of the first periodic layered element (A) in the MQW structure may range from 2 to 29.

Each of the first periodic layered element (A) includes a first layer 121, a second layer 122 which is disposed on the first layer 121, and a third layer 123 which is disposed on the second layer 122. The first layers 121, the second layers 122 and the third layers 123 in the first periodic layered elements (A) are alternately stacked on one another.

For each of the first periodic layered elements (A), the first, second and third layers 121, 122, 123 respectively have a first energy bandgap (Eg1), a second energy bandgap (Eg2), and a third energy bandgap (Eg3) that satisfy a relationship of Eg1<Eg2<Eg3. With the first and second layers 121, 122 respectively serving as a well region and a barrier region which are alternately stacked, carriers (i.e., electron-hole pairs) injected into the light emitting component 120 can be confined therein, so as to increase the concentration of the electron-hole pairs and the possibility of recombination, thereby improving the emission efficiency of the epitaxial light emitting structure 100. With the third layer 123 being disposed on the second layer 122 to form an additional potential barrier, an improved confinement of the electron-hole pairs can be achieved. The third energy bandgap (Eg3) of the third layer 123 showing a potential barrier spike in a bandgap diagram of the epitaxial light emitting structure 100 may prevent the carriers from overflowing, which may occur in a tilted energy band due to application of an external bias to the epitaxial light emitting structure 100, so as to increase the efficiency of radial recombination and brightness of the epitaxial light emitting structure 100.

Moreover, a material having a larger energy bandgap indicates that the material exhibits a proper insulation property. The third layer 123 formed with an appropriate thickness in each of the first periodic layered elements (A) may block a reverse current, and reduces current leakage so as to decrease an aging time of the epitaxial light emitting structure 100. In this embodiment, for each of the first periodic layered elements (A), the third layer 123 has a thickness not greater than 30 Å, such as 10 Å to 15 Å. When the third layer 123 has a too small thickness (such as lower than 10 Å, e.g., from 5 Å to lower than 10 Å), less carriers are confined in the epitaxial light emitting structure 100. On the other hand, the third layer 123 having a thickness greater than 30 Å may have poor conductivity, and thus light emitting performance of the light emitting component 120 may be reduced and the external bias applied thereto will be increased during operation.

By controlling the second energy bandgap (Eg2) to be lower than the third energy bandgap (Eg3), the stress in the MQW structure can be well modulated. For each of the first periodic layered elements (A), a difference between the third energy bandgap (Eg3) and the second energy bandgap (Eg2) is equal to or larger than 1.5 eV, so as to effectively confine the carriers and reduce overflow thereof.

The epitaxial light emitting structure 100 is adapted for use in a GaN-based light emitting diode (LED), and is configured to emit a light having an emission wavelength that ranges from 210 nm to 420 nm. The light may include, but is not limited to, a UVC radiation having a peak wavelength ranging from 210 nm to 280 nm, a UVB radiation having a peak wavelength ranging from 280 nm to 320 nm, and a UVA radiation having a peak wavelength ranging from 320 nm to 420 nm. In certain embodiments, the epitaxial light emitting structure 100 is configured to emit ultraviolet (UV) light which has an emission wavelength ranging from 350 nm to 370 nm. For each of the first periodic layered elements (A), the first layer 121 may be made of one of AlGaN, GaN and InGaN. With different contents of aluminum (Al) or indium (In) doped in the first layer 121, light having varied wavelengths can be provided. In general, the first layer 121 including a higher Al content provides a light having a shorter wavelength, and the first layer 121 including a higher In content provides a light having a longer wavelength. The first, second and third layers 121, 122, 123 in each of the first periodic layered elements (A) may be made of one of the following combinations: AlGaN/AlGaN/AlN, GaN/AlGaN/AlN, InGaN/AlGaN/AlN, InGaN/InAlGaN/AlN and InGaN/GaN/AlN.

In this embodiment, to generate a UVA radiation having a peak wavelength ranging from 360 nm to 420 nm, the first layer 121 of each of the first periodic layered elements (A) is made of $In_xGa_{1-x}N$, where $0 \le x \le 1$. In other embodiments, x ranges from 0 to 0.1. The numeral x can be varied to adjust the emission wavelength of the light, in which a larger x generates a shorter emission wavelength, while a smaller x generates a longer emission wavelength. That is, the In content in the first layer 121 can be varied to control the first energy bandgap (Eg1), thereby adjusting the emission wavelength of the light. For example, the peak wavelength is 365 nm when x is approximately 0.005, the peak wavelength ranges from 385 nm to 395 nm when x ranges from 0.03 to 0.05, and the peak wavelength is 400 nm when x is approximately 0.08. The second layer 122 of each of the first periodic layered elements (A) is made of $In_yAl_zGa_{1-y-z}N$, where $0 \le y < 1$, $0 \le z < 1$ and $y+z \le 1$. For example, the second layer 122 may be made of InAlGaN or AlGaN. In one aspect, the second layer 122 is made of $Al_zGa_{1-z}N$, where $0 \le y \le 0.02$ and $0.06 \le z \le 0.12$. The third layer 123 of each of the first periodic layered elements (A) is made of $Al_wGa_{1-w}N$, where $0 < w \le 1$. In one aspect, the third layer 123 is made of $Al_wGa_{1-w}N$, where $0.95 \le w \le 1$. For example, the third layer 123 may be made of AlN. The Al and In contents of the second layer 122 may be varied to adjust the second energy bandgap (Eg2), and the Al content of the third layer 123 may be varied to adjust the third energy bandgap (Eg3). For each of the first periodic layered elements (A), the first energy bandgap (Eg1) of the first layer 121 ranges from 3.3 eV to 3.5 eV, such as 3.3 eV to 3.4 eV. The first layer 121 may have a thickness lower than 300 Å. The second energy bandgap (Eg2) of the second layer 122 ranges from 3.55 eV to 3.9 eV, such as 3.59 eV to 3.70 eV. The second layer 122 may have a thickness lower than 300 Å. The third energy bandgap (Eg3) of the third layer 123 is 6.2 eV. The third layer 123 may have a thickness ranging from 10 Å to 15 Å. It is noted that when the first layer 121 is made of $In_xGa_{1-x}N$, where $0 < x \le 0.1$, and the third layer 123 is made of $Al_wGa_{1-w}N$, where $0 < w \le 1$, a large energy bandgap difference would be generated between the first layer 121 and the third layer 123, causing a large lattice mismatch therebetween, and such lattice mismatch may become more serious as the In content of the first layer 121 or the Al content of the third layer 123 increases. In addition, since the first layer 121 made of InGaN needs to be grown under a relatively low growth temperature, the growth temperature of the third layer 123 made of AlN is also low. Therefore, the thickness of the third layer 123 is controlled to be lower than 30 Å, so as to reduce lattice mismatch and improve crystal quality, thereby improving emission efficiency of the LED.

The MQW structure in an LED made of nitride-based semiconductor materials mainly adopts In and Al doping materials to obtain well layers and barrier layers. The lattice constant of InN, GaN and AlN has a relationship of InN>GaN>AlN. In this embodiment, each of the first periodic layered elements (A) of the MQW structure includes three layers having a stepped variation of the lattice constant, i.e., InGaN (the first layer 121)>InAlGaN or AlGaN (the second layer 122)>AlGaN or AlN (the third layer 123), such that lattice mismatch between these layers in the MQW structure can be reduced and the stress generated therein may also be effectively released so as to improve crystal quality. As compared to the first embodiment of the MQW structure shown in FIG. 1 (i.e., the first layers 121, the second layers 122, and the third layers 123 are alternately stacked on one another in a direction away from the n-type semiconductor layer 110), a comparative embodiment with respect to the first embodiment is shown in FIG. 3, in which the first layers 121, the third layers 123, and the second layers 122 in such order in the first periodical layered elements (A) are alternately stacked on one another in the direction away from the n-type semiconductor layer 110. That is, for each of the first periodic layered elements (A), the third layer 123 is disposed between the first layer 121 and the second layer 122. Since a large energy bandgap difference is present between the first layer 121 and the third layer 123, the hole mobility in the comparative embodiment is smaller than that of the first embodiment. The stress released in the comparative embodiment is also less than that in the first embodiment due to a relatively large stress difference between the first layer 121 and the third layer 123.

The epitaxial light emitting structure 100 of this disclosure may be formed on a growth substrate by metal organic chemical vapor deposition (MOCVD), and then transferred to a supporting substrate 200, thereby obtaining an LED 10 of this disclosure (see FIG. 2), which has a vertical structure (i.e., vertical LED). Alternatively, the LED may also be a horizontal LED or a flip-chip LED.

Figure 2:
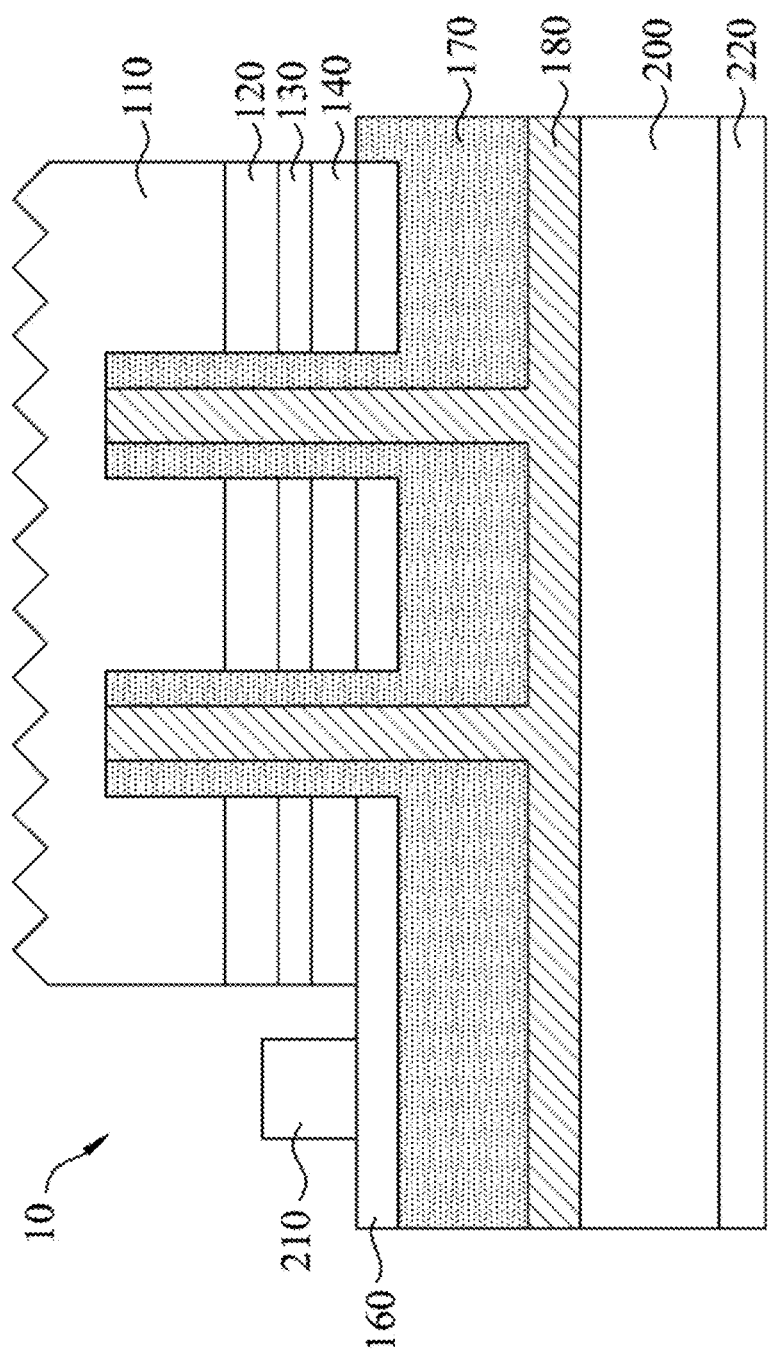
FIG. 2 is a schematic view illustrating an embodiment of a light emitting diode (LED) according to the disclosure.

Referring to FIG. 2, the vertical LED 10 includes the epitaxial light emitting structure 100 as mentioned above, in which the p-type semiconductor layer 140 faces the supporting substrate 200, and the n-type semiconductor layer 110 has a light exit surface. The epitaxial light emitting structure 100 may be formed with at least one hole that extends through the p-type semiconductor layer 140, the p-type electron blocking layer 130 and the light emitting component 120, and that terminates at and exposes the n-type semiconductor layer 110. The vertical LED 10 may further include a first metal layer 160, an insulating layer 170 and a second metal layer 180 that are formed between the supporting substrate 200 and the epitaxial light emitting structure 100. Specifically, the first metal layer 160 is disposed on the p-type semiconductor layer 140 opposite to the light emitting component 120, and may include a metal reflective material for reflecting the light emitted from the light emitting component 120. The insulating layer 170 covers the first metal layer 160 and a side wall of the epitaxial light emitting structure 100 exposed from the hole. The second metal layer 180 is disposed on the insulating layer 170 opposite to the first metal layer 160 and fills the hole to contact the n-type semiconductor layer 110. The second metal layer 180 may include a metallic adhesive material for bonding to the supporting substrate 200. The vertical LED 10 may further include a first electrode 210 that is electrically connected to the first metal layer 160, and a second electrode 220 that is disposed on the supporting substrate 200 opposite to the second metal layer 180.

Two UV vertical LED samples emitting light that has a peak wavelength ranging from 365 nm to 370 nm, i.e., Experimental sample 1 (E1) and Comparative sample 1 (C1), are prepared (each having a size of 325 μm×325 μm).

Figure 4B:
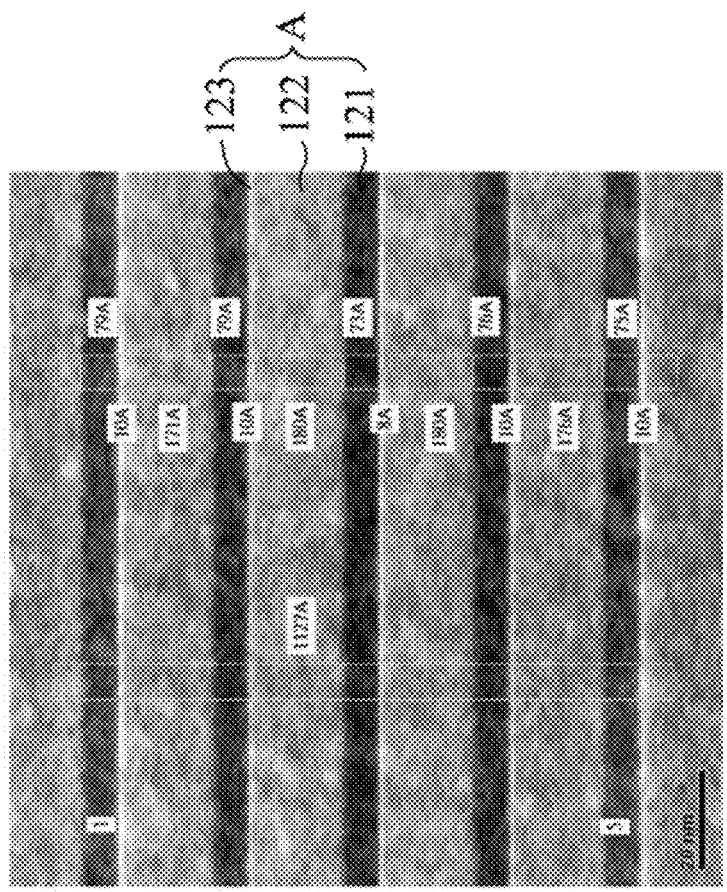
FIGS. 4A and 4B are transmission electron microscopy (TEM) images of the first embodiment.
Figure 4A:
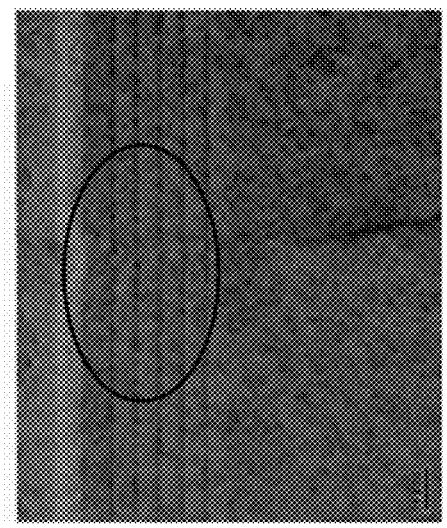
Figure 5:
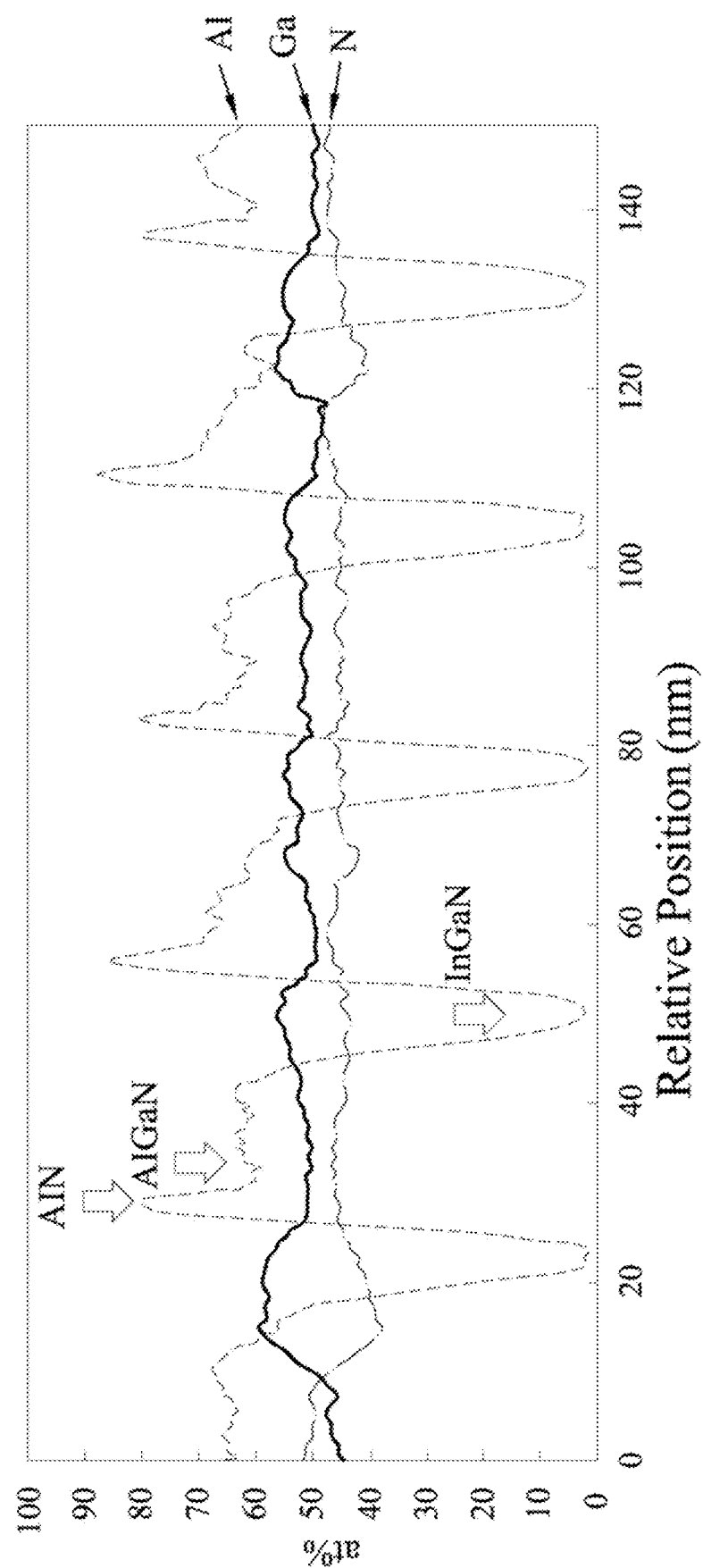
FIG. 5 is an energy dispersive X-ray (EDX) elemental line profile of the first embodiment.

Specifically, Experimental sample 1 (E1) has an epitaxial light emitting structure 100 of the first embodiment as shown in FIG. 1, which was first grown on a sapphire substrate and then transferred to a supporting substrate made of silicon. Each of the n-type semiconductor layer 110, the p-type electron blocking layer 130 and the p-type semiconductor 140 is made of AlGaN. With regard to the light emitting component 120, the multiple quantum well structure contains five of the first periodic layered elements (A), each including the first layer 121 made of $In_{0.65}Ga_{0.95}N$ and having an average thickness of 76 Å, the second layer 122 made of $Al_{0.08}Ga_{0.92}N$ and having an average thickness of 177 Å, and the third layer 123 made of AlN and having an average thickness of 10 Å (see TEM images shown in FIGS. 4A and 4B). In certain embodiments, the multiple quantum well structure of the light emitting component 120 has a total thickness ranging from 100 Å to 3000 Å. Referring further to FIG. 5, an EDX elemental line profile of the light emitting component 120 of the first embodiment indicates variation of Al, Ga and N contents in each of the first periodic layered elements (A), as well as the distribution and relative thickness of each of the first, second and third layers 121, 122, 123.

Comparative sample 1 (C1) has an epitaxial light emitting structure similar to that of E1, except that the third layer is omitted in each of the first periodic layered elements (A). That is, the MQW structure of C1 contains five of the conventional periodic layered elements, each of which merely includes the first layer 121 made of $In_{0.05}Ga_{0.95}N$ and having an average thickness of 76 Å, and the second layer 122 made of $Al_{0.08}Ga_{0.92}N$ and having an average thickness of 177 Å.

Since a circular carrier plate is used for growing the epitaxial light emitting structure by MOCVD, the epitaxial light emitting structure formed in different positions on the circular carrier plate may have different growth qualities. Therefore, two LEDs of E1, i.e., E1a and E1b respectively grown at positions a and b on the circular carrier plate, and two LEDs of C1 (i.e., C1a and C1b) respectively grown at positions a and b on the circular carrier plate were subjected to determination of light output power under a current of 150 mA.

Figure 6:
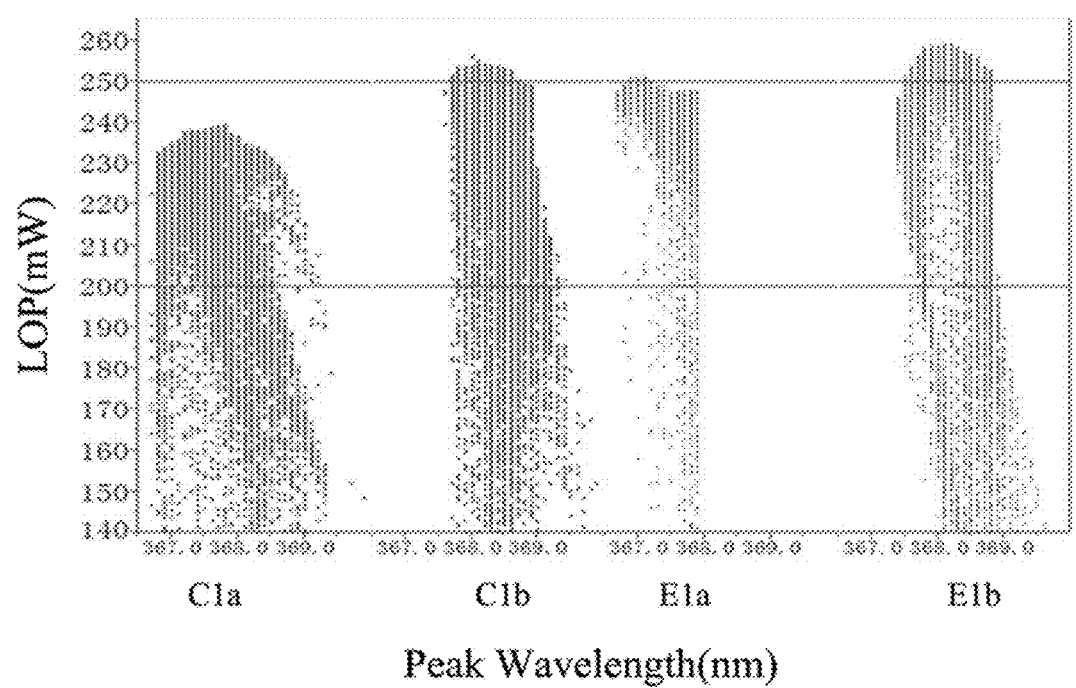
FIG. 6 is a scatter plot illustrating light output power (abbreviated as LOP) of the LEDs of Experimental sample 1 (i.e., E1a and E1b) and Comparative sample 1 (i.e., C1a and C1b) at different peak wavelengths.

As shown in FIG. 6, although the LEDs of E1a, E1b, C1a and C1b emit light having a similar wavelength range (i.e., from 365 nm to 370 nm), the light output power of the LEDs of E1a and E1b are higher than that of C1a and C1b, which indicates that luminance of the LEDs according to this disclosure can be greatly enhanced. The LEDs of E1a and E1b were also subjected to a test for a hot/cold (H/C) factor determination at 25° C. and at 85° C. The LEDs of E1a and E1b have a H/C factor ranging from 78% to 80%, which is higher than that of a conventional LEDs (i.e., H/C factor lower than 70%). Therefore, the LED of this disclosure can exhibit an enhanced luminance stability during operation in a thermal state.

Each of the LEDs of E1a, E1b, C1a and C1b was subjected to an aging test described as follows. To be specific, each LED was lit up for 48 hours or 96 hours under a current of 150 mA, at a junction temperature of 125° C. and at an environmental temperature of 65° C. Then, a reverse bias of 5 V was applied to each LED to determine leakage current therein, so as to measure an initial light output power ($LOP_i$), an aged light output power ($LOP_{48/96}$), an aged forward voltage ($Vf_{48/96}$) and an aged reverse current ($IR_{48/96}$) of each LED. A decay rate of light, a change of the forward voltage ($\Delta Vf$) between an initial forward voltage ($Vf_i$) (i.e., when the LED was not lit up) and the aged forward voltage, and leakage current, i.e., a change of the reverse current (ΔIR) between an initial reverse current ($IR_i$) and the aged reverse current, were respectively calculated based on the formulas below:

Decay rate of light=($LOP_{48/96}$/$LOP_i$)×100%

$\Delta Vf=Vf_{48/96}-Vf_i$;

$\Delta IR=IR_{48/96}-IR_i$.

When the ΔIR is smaller, the light emitting component 120 has better quality and current flow through the p-n junction of the light emitting component 120 under the reverse bias is less, indicating the LED exhibits a more stabilized reverse characteristic during operation.

TABLE 1

| Sample | Decay rate of light (%) | | Change of forward voltage ΔVf (V) | | ΔIR | |
|---|---|---|---|---|---|---|
| | 48 hr | 96 hr | 48 hr | 96 hr | 48 hr | 96 hr |
| E1a | 95.80 | 94.84 | −0.014 | −0.002 | 0.92 | 1.38 |
| E1b | 96.18 | 93.96 | −0.012 | 0.059 | 0.93 | 1.40 |
| C1a | 95.10 | 93.65 | −0.019 | −0.004 | 1.24 | 1.80 |
| C1b | 96.18 | 95.79 | −0.027 | 0.016 | 1.67 | 2.67 |

As shown in Table 1, the decay rate of light and the ΔIR in E1a and E1b are less than those in C1a and C1b, which indicates that the LED of this disclosure, which includes a plurality of the third layers 123 in the epitaxial light emitting structure 100, can reduce current leakage and exhibit improved durability.

Figure 7:
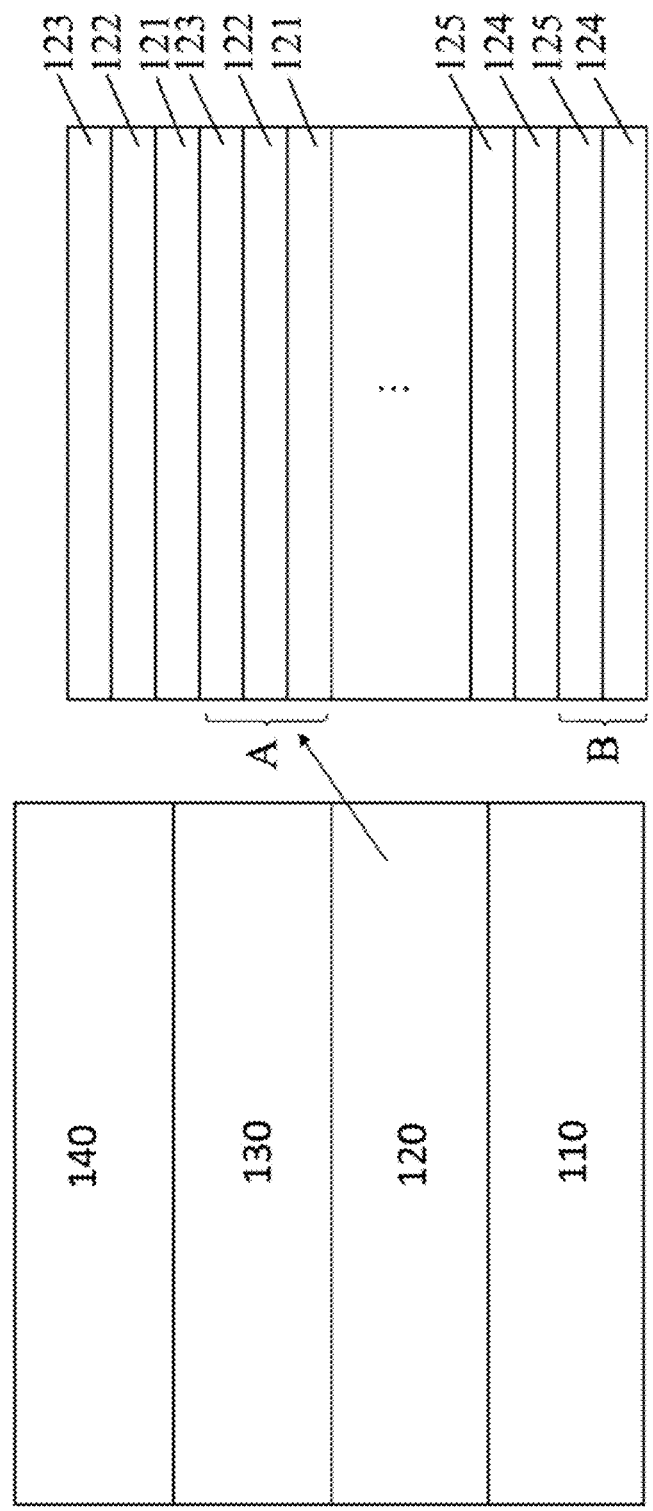
FIG. 7 is a schematic view illustrating a second embodiment of the epitaxial light emitting structure according to the disclosure.

Referring to FIG. 7, a second embodiment of the epitaxial light emitting structure 100 according to this disclosure is similar to the first embodiment except that in the second embodiment, the MQW structure further contains at least one second periodic layered element (B) which includes a fourth layer 124 and a fifth layer 125. The fourth layer 124 and the fifth layer 125 may be made of different materials that are independently selected from materials for making the first layer 121, the second layer 122, and the third layer 123. For example, the fourth layer 124 and the fifth layer 125 may be respectively made of materials for making the first layer 121 and the second layer 122.

In this embodiment, the first periodic layered elements (A) are disposed on the p-type electron blocking layer 130 opposite to the p-type semiconductor layer 140, and the at least one second periodic layered element (B) is disposed between the n-type semiconductor layer 110 and the first periodic layered elements (A). The first, second and third layers 121, 122 and 123 in each of the first periodic layered elements (A) are respectively made of InGaN, AlGaN and AlN. The fourth and fifth layers 124, 125 in each of the second periodic layered elements (B) may be respectively made of materials for making the first and second layers 121, 122 (i.e., InGaN and AlGaN). The number of the first periodic layered elements (A) is more than 2, such as from 2 to 29. The number of the second periodic layered elements (B) ranges from 1 to 28.

In a variation of the second embodiment, the at least one second periodic layered element (B) is disposed on the p-type electron blocking layer 130 opposite to the p-type semiconductor layer 140, and the first periodic layered elements (A) are disposed between the n-type semiconductor layer 110 and the second periodic layered elements (B).

Figure 8:
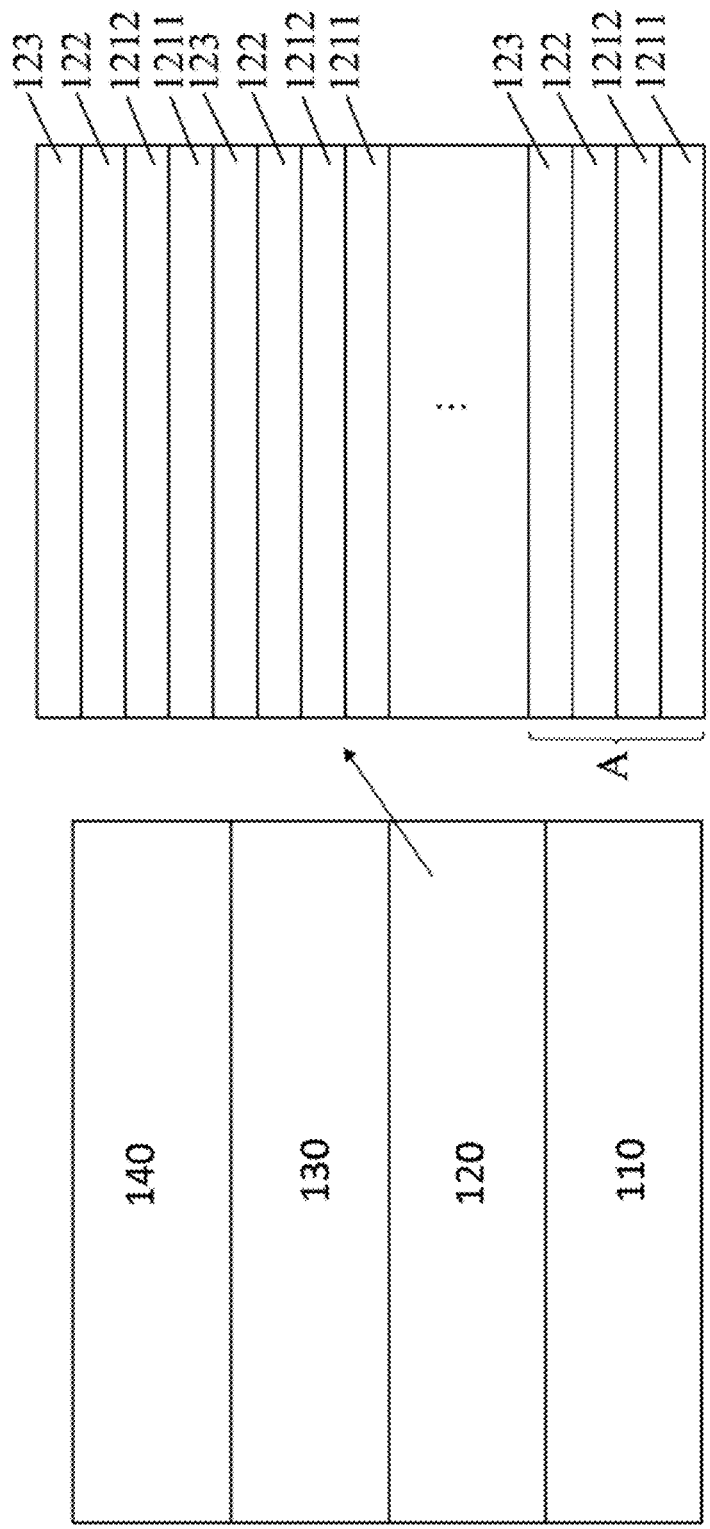
FIG. 8 is a schematic view illustrating a third embodiment of the epitaxial light emitting structure according to the disclosure.

Referring to FIG. 8, a third embodiment of the epitaxial light emitting structure 100 according to this disclosure is similar to the first embodiment except that in the third embodiment, for at least one of the first periodic layered elements (A), the first layer 121 includes a first lower sublayer 1211 and a first upper sublayer 1212 which is disposed between the first lower sublayer 1211 and the second layer 122. The first upper sublayer 1212 has an energy bandgap that is greater than an energy bandgap of the first lower sublayer 1211 and that is smaller than that of the second energy bandgap (Eg2). In this embodiment, the first lower sublayer 1211 is made of $In_{x1}Ga_{1-x1}N$ and the first upper sublayer 1212 is made of $In_{x2}Ga_{1-x2}N$, where x1 and x2 independently range from 0 to 0.03, and x1 is greater than x2.

Figure 9:
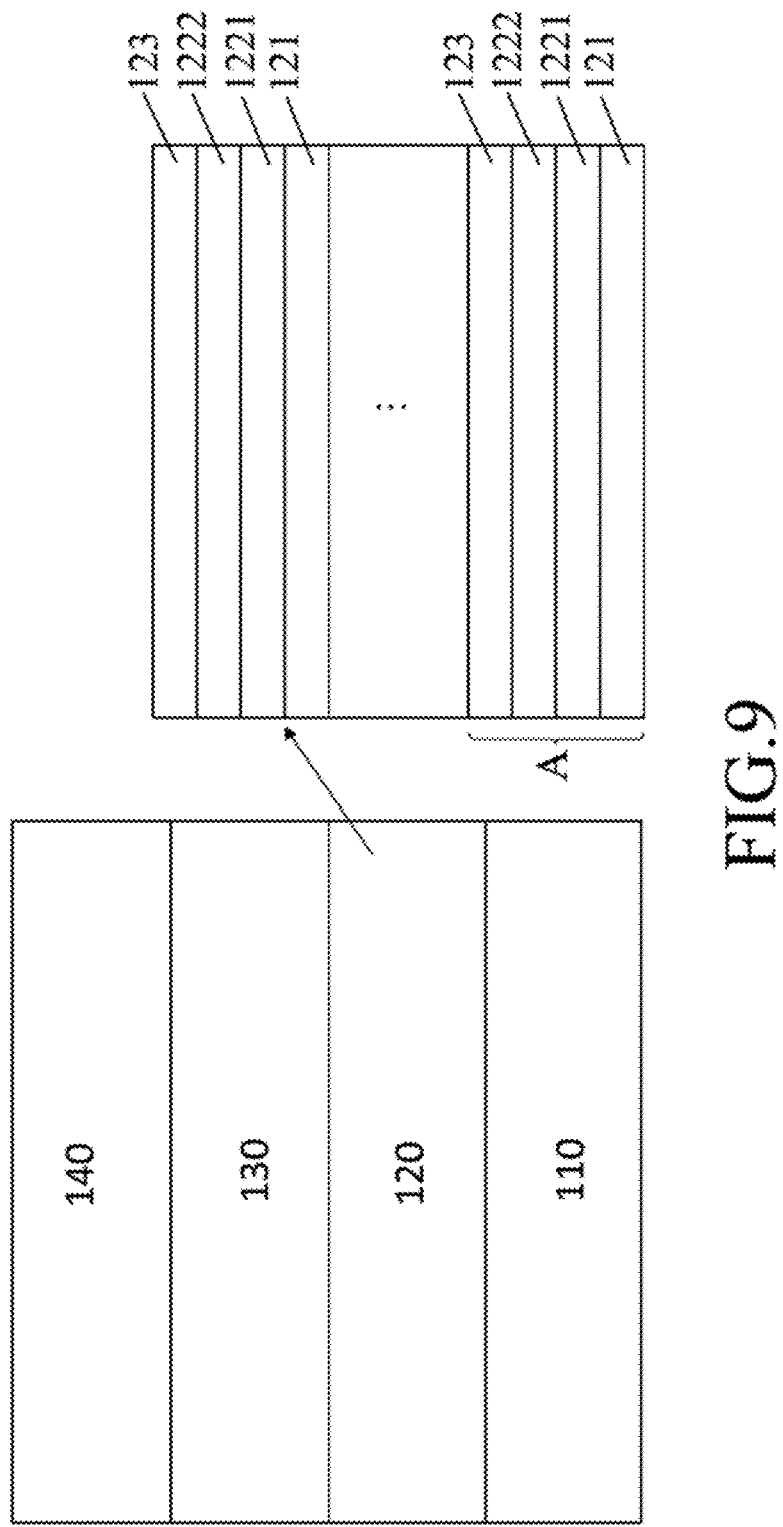
FIG. 9 is a schematic view illustrating a fourth embodiment of the epitaxial light emitting structure according to the disclosure.

Referring to FIG. 9, a fourth embodiment of the epitaxial light emitting structure 100 according to this disclosure is similar to the first embodiment except that in the fourth embodiment, for at least one of the first periodic layered elements (A), the second layer 122 includes a second lower sublayer 1221 and a second upper sublayer 1222 which is disposed between the second lower sublayer 1221 and the third layer 123. The second upper sublayer 1222 has an energy bandgap greater than an energy bandgap of the second lower sublayer 1221. In this embodiment, the second lower sublayer 1221 and the second upper sublayer 1222 are made of $In_yAl_zGa_{1-y-z}N$ with different In and Al contents, where y ranges from 0 to 0.002 and z ranges from 0.06 to 0.12.

Figure 10:
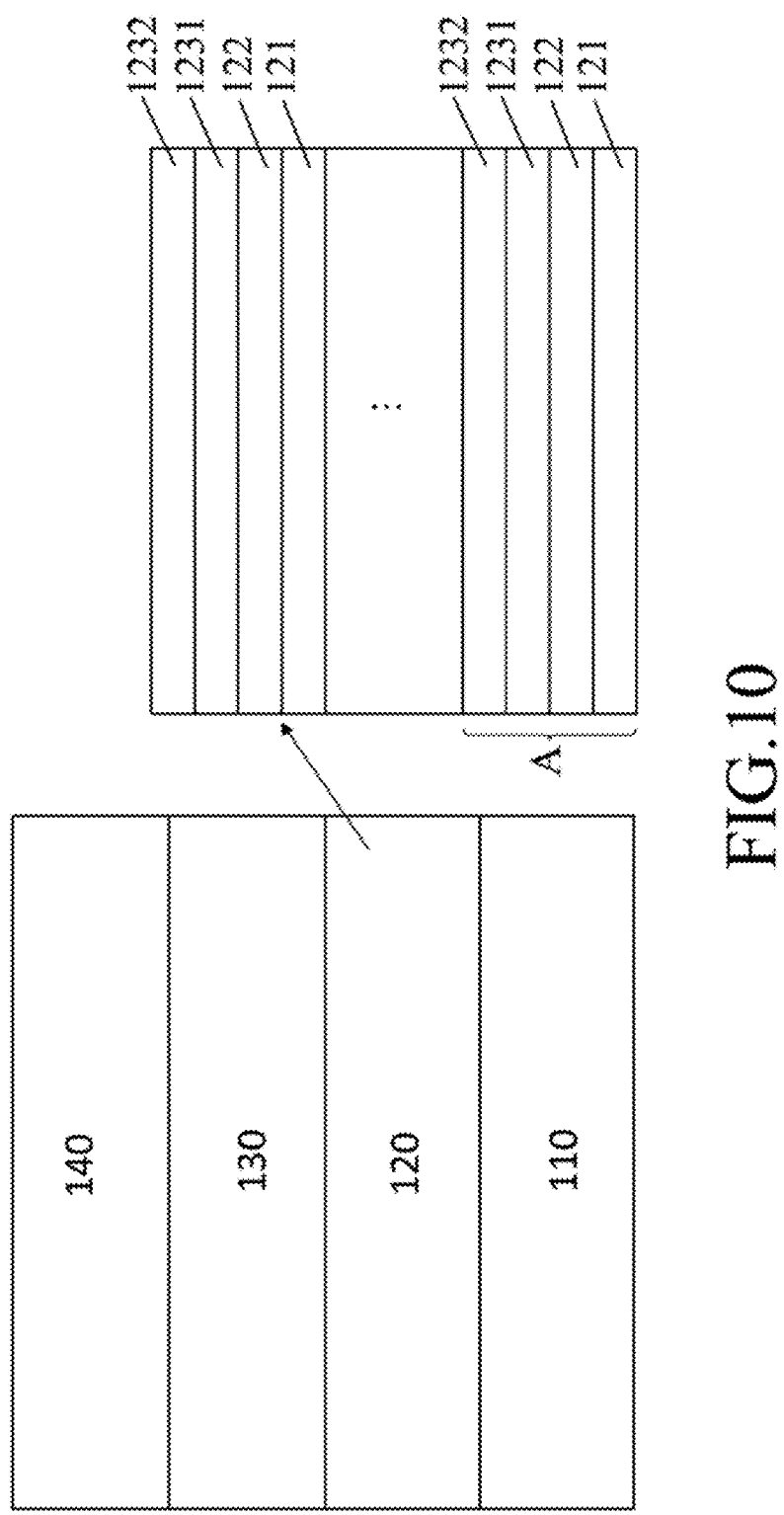
FIG. 10 is a schematic view illustrating a fifth embodiment of the epitaxial light emitting structure according to the disclosure.

Referring to FIG. 10, a fifth embodiment of the epitaxial light emitting structure 100 according to this disclosure is similar to the second embodiment except that in the fifth embodiment, for at least one of the first periodic layered elements (A), the third layer 123 includes a third lower sublayer 1231 and a third upper sublayer 1232 which is disposed on the third lower sublayer 1231 opposite to the second layer 122. The third lower sublayer 12131 has an energy bandgap greater than the second energy bandgap (Eg2), and the third upper sublayer 1232 has an energy bandgap greater than that of the third lower sublayer 1231. A difference between the energy bandgap of the third lower sublayer 1231 and the second energy bandgap (Eg2) is equal to or larger than 1.5 eV. The third lower sublayer 1231 and the third upper sublayer 1232 are made of AlGaN and AlN, respectively.

In conclusion, by forming an additional barrier layer (i.e., the third layer 123) having a relatively high energy bandgap on the conventional MQW structure having alternately stacked first and second layers 121, 122 that serves as the well and barrier regions, the epitaxial light emitting structure 100 of this disclosure can exert an additional confinement effect for carriers. Since the energy bandgap of the third layer 123 is greater than those of the first and second layer 121, 122, when the energy band is tilted under an external bias applied to the epitaxial light emitting structure 100 of the LED 10, a potential barrier spike can be generated to prevent carrier overflow, thereby increasing efficiency of radial recombination and luminance of the LED of this disclosure.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An epitaxial light emitting structure, comprising:
   an n-type semiconductor layer;
   a p-type semiconductor layer; and
   a light emitting component disposed between said n-type semiconductor layer and said p-type semiconductor layer and including a multiple quantum well structure which contains a plurality of first periodic layered elements,
   wherein each of said first periodic layered element includes a first layer, a second layer which is disposed on said first layer, and a third layer which is disposed on said second layer, said first layers, said second layers and said third layers in said first periodic layered elements being alternately stacked on one another;
   wherein for each of said first periodic layered elements:
   said first layer is made of $In_xGa_{1-x}N$, where $0 \leq x \leq 1$,
   said second layer is made of $Al_zGa_{1-z}N$, where $0 \leq z \leq 1$,
   said third layer is made of AlN and has a thickness not greater than 30 Å, and
   said first, second and third layers respectively have a first energy bandgap (Eg1), a second energy bandgap (Eg2), and a third energy bandgap (Eg3) that satisfy a relationship of Eg1<Eg2<Eg3.

2. The epitaxial light emitting structure of claim 1, wherein for each of said first periodic layered elements, a difference between the third energy bandgap (Eg3) and the second energy bandgap (Eg2) is equal to or larger than 1.5 eV.

3. The epitaxial light emitting structure of claim 1, wherein said first layers, said second layers, and said third layers in said first periodical layered elements are alternately stacked on one another in a direction away from said n-type semiconductor layer.

4. The epitaxial light emitting structure of claim 1, wherein for at least one of said first periodic layered elements, said first layer includes a first lower sublayer and a first upper sublayer which is disposed between said first lower sublayer and said second layer, and which has an energy bandgap greater than an energy bandgap of said first lower sublayer and smaller than that of the second energy bandgap (Eg2).

5. The epitaxial light emitting structure of claim 1, wherein for at least one of said first periodic layered elements, said second layer includes a second lower sublayer and a second upper sublayer which is disposed between said second lower sublayer and said third layer, and which has an energy bandgap greater than an energy bandgap of said second lower sublayer.

6. The epitaxial light emitting structure of claim 1, wherein for at least one of said first periodic layered elements, said third layer includes a third lower sublayer which has an energy bandgap greater than the second energy bandgap (Eg2), and a third upper sublayer which is disposed on said third lower sublayer opposite to said second layer and which has an energy bandgap greater than that of said third lower sublayer.

7. The epitaxial light emitting structure of claim 1, wherein said multiple quantum well structure further contains at least one second periodic layered element which includes a fourth layer and a fifth layer.

8. The epitaxial light emitting structure of claim 7, wherein said fourth layer and said fifth layer are made of different materials that are independently selected from materials for making said first layer, said second layer, and said third layer.

9. The epitaxial light emitting structure of claim 1, wherein a number of said first periodic layered element in said multiple quantum well structure ranges from 2 to 29.

10. The epitaxial light emitting structure of claim 1, wherein for each of said first periodic layered elements, the first energy bandgap (Eg1) of said first layer ranges from 3.3 eV to 3.5 eV.

11. The epitaxial light emitting structure of claim 1, wherein for each of said first periodic layered elements, the second energy bandgap (Eg2) of said second layer ranges from 3.55 eV to 3.90 eV.

12. The epitaxial light emitting structure of claim 1, wherein for each of said first periodic layered elements, a difference between the second energy bandgap (Eg2) and the first energy bandgap (Eg1) ranges from 0.25 eV to 0.30 eV.

13. The epitaxial light emitting structure of claim 1, wherein for each of said first periodic layered elements, said first layer has a thickness ranging from 20 Å to 150 Å.

14. The epitaxial light emitting structure of claim 1, wherein for each of said first periodic layered elements, said second layer has a thickness ranging from 50 Å to 300 Å.

15. The epitaxial light emitting structure of claim 1, wherein the thickness of said third layer ranges from 10 Å to 15 Å.

16. The epitaxial light emitting structure of claim 1, wherein said multiple quantum well structure of said light emitting component has a total thickness ranging from 100 Å to 3000 Å.

17. The epitaxial light emitting structure of claim 1, wherein each of said n-type semiconductor layer, said light emitting component and said p-type semiconductor layer is made of a nitride-based semiconductor material.

18. A light emitting diode, comprising an epitaxial light emitting structure as claimed in claim 1.

* * * * *